United States Patent [19]

Ross et al.

[11] 4,135,557
[45] Jan. 23, 1979

[54] HEADER LEAD ROLLER

[75] Inventors: John P. Ross, Cupertino; Carl E. Bernardi, San Jose, both of Calif.

[73] Assignee: National Semiconductor Corporation, Santa Clara, Calif.

[21] Appl. No.: 847,402

[22] Filed: Oct. 31, 1977

[51] Int. Cl.² ............................................. B21F 45/00
[52] U.S. Cl. .................................... 140/105; 140/147; 72/DIG. 10
[58] Field of Search ....................... 140/105, 140, 147; 72/DIG. 10

[56] References Cited

U.S. PATENT DOCUMENTS

| 2,390,139 | 12/1945 | Vasselli | 140/147 |
| 3,336,954 | 8/1967 | Bach et al. | 140/105 |
| 3,570,559 | 3/1971 | Palmer | 140/147 |
| 4,003,414 | 1/1977 | Halligan | 140/147 |

Primary Examiner—Lowell A. Larson
Attorney, Agent, or Firm—Brown & Martin

[57] ABSTRACT

The leads on a Semiconductor Package of the type having a generally round configuration and generally termed a header, are crimped into a conducting relationship for plating by means of an apparatus comprising a track type of conveyer for conveying the headers along a specific path, and a pair of rollers disposed on opposite sides of the track for engaging the leads as the header passes therebetween for crimping the leads together in a conducting relationship. The rollers comprise wheels mounted for rotation in opposite directions at different speeds, such that the header is rotated between the wheels but simultaneously moved in a linear direction along the conveyer.

9 Claims, 5 Drawing Figures

HEADER LEAD ROLLER

BACKGROUND OF THE INVENTION

The present invention relates to semiconductor production apparatus and pertains particularly to lead crimping apparatus for crimping leads of a header into a conducting relationship.

Many integrated circuits are plated at some stage during the production thereof. This plating usually takes place after the circuit has been packaged. The leads of the circuit must have a mutual continuity in order to be plated properly. This is accomplished by establishing a connection between the leads, preferably by crimping the leads into a contacting or conducting relationship.

Conventional integrated circuits are currently packaged in three distinctive configurations. These are round, flatpack, and dual in line (DIP). The round style is usually a glass metal package having multiple leads extending from one side thereof parallel to the axis of the body and in a substantially circular array. The leads on such round packages are usually bent or crimped into mutual contact before plating, in order to provide mutual continuity in the lead. These round packages are generally termed in the art, headers.

The crimping of the leads into an engaging or conducting relationship have been accomplished in the past by means of a conical die as shown in FIG. 5 which is moved axially into engagement with the leads of the header for camming them into contact. The die is usually reciprocally mounted on a machine and engages the leads of the respective headers as they pass thereby. One problem with such approach however, is that the leads of the header must be precisely in line with the die in order to be effective. Another problem is that when leads are bent outward from their normal position the die is ineffective and will tend to bend the particular lead further out of alignment.

In accordance with the prior art approach, as shown in FIG. 5, a semiconductor device 10, having been packaged in a substantially circular or rounded configuration, includes a plurality of leads 12, 14, 16 and 18 extending axially from one side parallel to the axis thereof and formed in a generally circular array. The process of crimping the leads into contact is carried out by means of a die 20 having a conical camming surface or portion 22 which axially engages the leads 12 through 18 for bending them into contenting engagement. The major problem with this approach is that a lead such as lead 18 may be bent outward from the remaining leads and not be engaged within the camming surface 22 of the die 20. Thus, this lead 18 is not crimped inward with the remaining leads and instead may be further bent outward. This arrangement results in many rejects and increases the cost of production.

Another problem with the prior art approach is that the speed of production in the crimping operation is limited, thereby further increasing the cost of production.

It is therefore desirable that some method and/or apparatus be available for quickly and effectively crimping the leads of semiconductor devices, and which is capable of properly crimping damaged or excessively outwardly bent semiconductor leads.

SUMMARY AND OBJECTS OF THE INVENTION

Accordingly it is the primary object of the present invention to overcome the above problems of the prior art.

Another object of the present invention is to provide an improved semiconductor lead crimping apparatus for crimping semiconductor leads into a conducting relationship.

A further object of the present invention is to provide a rapid and effective semiconductor lead crimping method and apparatus that is simple and inexpensive and capable of high production volume.

In accordance with the primary aspect of the present invention a semiconductor lead crimping apparatus includes a guiding track or conveying channel for conveying a plurality of integrated circuits along a path, and first and second rotary discs disposed adjacent to the track for engaging and crimping the semiconductor or integrated circuit leads into conducting relationships.

BRIEF DESCRIPTION OF THE DRAWING

The above and other objects and advantages of the present invention will become apparent from the following description when read in conjunction with the drawings wherein.

DETAILED DESCRIPTION OF THE PREFERRED EMBODIMENT

Figure 1:
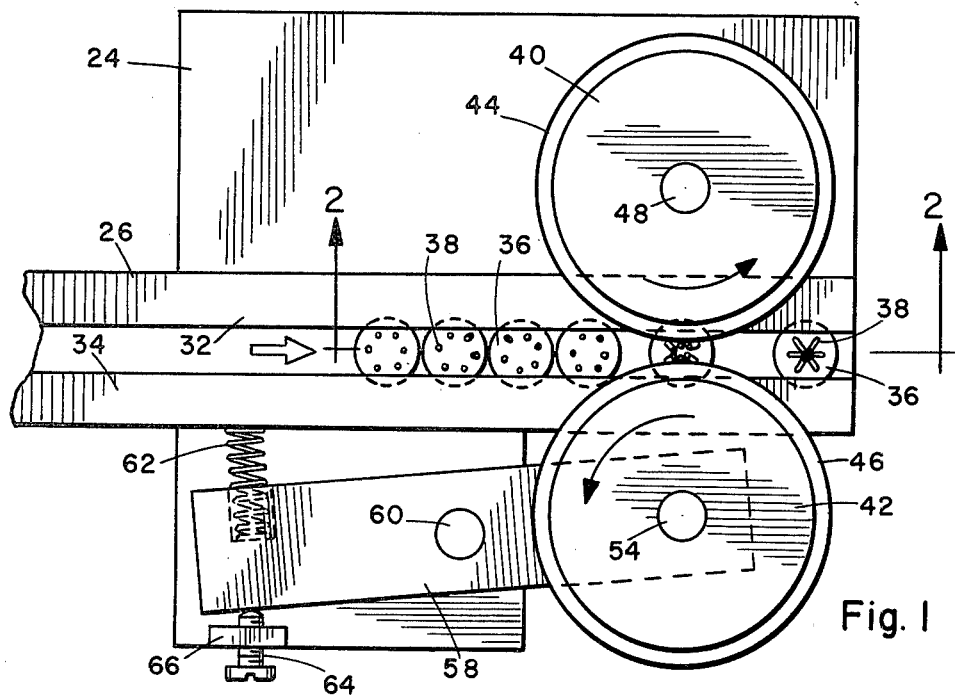
FIG. 1 is a top plan view of the apparatus of the present invention.
Figure 2:
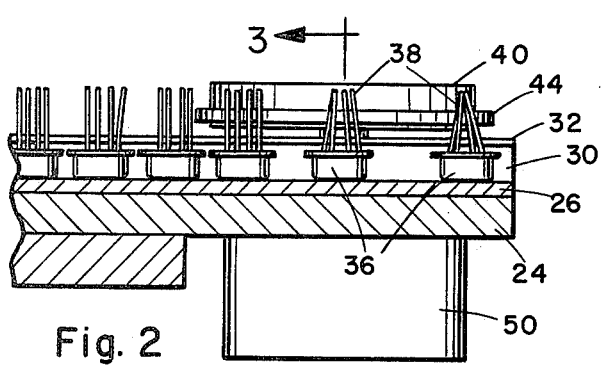
FIG. 2 is sectional view taken generally along line 2—2 of FIG. 1.
Figure 3:
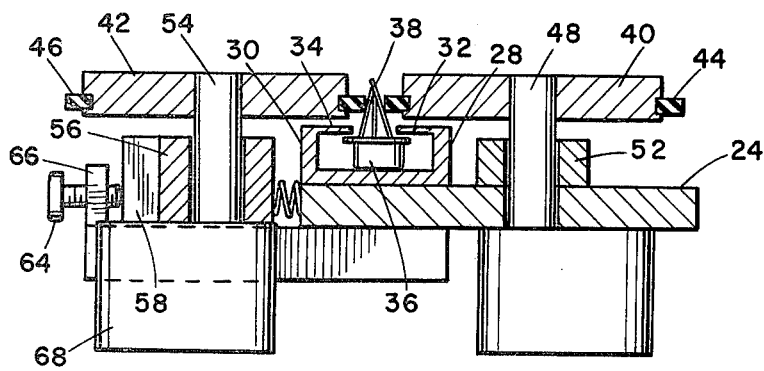
FIG. 3 is a sectional view taken on line 3—3 of FIG. 2.
Figure 5:
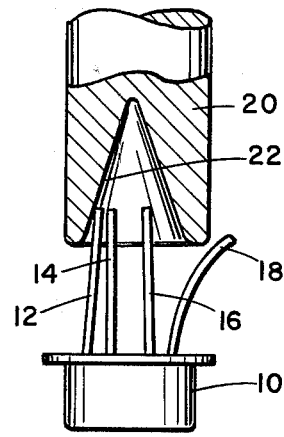
FIG. 5 illustrates the prior art.

Turning now to the drawings there is illustrated, as best seen in FIG. 1, an apparatus in accordance with a preferred embodiment of the present invention for crimping the leads of packaged integrated circuits. The apparatus comprises a base member 24 on which is mounted a suitable conveyer means 26 which in this instance comprises a elongated generally T-shaped channel which, as best seen in FIG. 3, includes side walls 28 and 30 and overlapping top flanges 32 and 34. The generally T-shaped open channel overlaps the body portion of a plurality of integrated circuits 36 with the leads there from 38 extending upward through the open slot between top flanges 32 and 34 externally of the channel. The headers may be loaded in and moved along the channel in any suitable manner, moving as shown in FIG. 1 to the right between a pair of crimping wheels 40 and 42.

These wheels each include rubber drive bands or the like 44 and 46, respectively. These drive bands are received in suitable grooves on the outer surface of the respective wheels 40 and 42. These are preferably of a material such as rubber or a like synthetic material, to provide some resilience and to enhance the grip thereof on the leads of the integrated circuit device.

The wheel 40 is mounted on a drive axle 48 driven in a suitable manner such as by motor or the like 50. The drive axle or shaft 48 is journaled in suitable bearing means or the like 52 secured or supported on the base or housing member 24. The wheel 40 is mounted in a fixed position as shown and having the outer surface of the band 44 overlapping the open portion of the channel 26 for engagement with the leads of a header passing along the channel.

The opposing wheel 42 is preferably mounted in a floating fashion on a drive shaft 54, journaled in a suitable bearing means 56 on a pivotal arm 58, which is pivoted by a pin or the like 60 on the housing or support member 24. Suitable means such as a spring 62 biases the wheel 42 toward the opposing wheel 40 for engagement with the leads of the integrated circuit device. Suitable adjusting means, such as a screw 64 threadably mounted in a bracket 66 for engaging the arm 58 is provided for adjusting the position of the wheel rim of the wheel 42 with respect to the wheel 40. Drive means, such as a motor or the like 68 may be provided for driving the second wheel 42.

Figure 4:
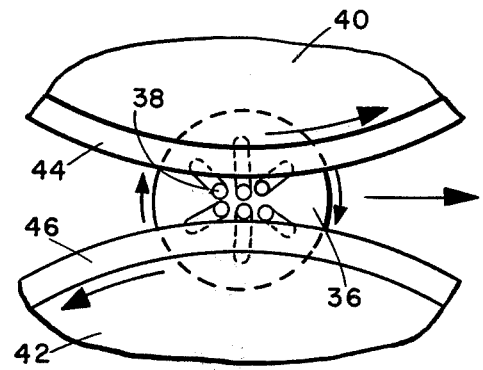
FIG. 4 is an enlarged top plan view showing the driving and rotary action by which the leads are crimped.

It should be noted that the wheels 40 and 42 rotate in the same direction with the rims thereof over the guide slot moving in opposite directions and at different speeds. In the preferred embodiment as illustrated, the wheel 40 rotates substantially faster than the wheel 42 and thus moves the headers 36 through the space between the respective wheels. The counterrotating rims engaging the respective leads of the respective headers rotate the headers in a clockwise direction, while at the same time moving the header through the space to the right, as in FIG. 4. The oppositely moving rims of the wheels insures that the headers will rotate upon engagement of the leads thereof by the rims of the wheels. The differential speed of rotation will insure that the headers will move between or through the space between the wheels.

The mounting of the wheel 42 of the moveable arm insures that the wheels will not cause injury to the fingers or the like of a worker which may happen to accidentally become engaged between the wheels.

This arrangement is such that the leads of the integrated circuit devices may be quickly and easily crimped to the contacting position as shown. The arrangement is also such that damaged leads such as those bent outward from close proximity to the remaining leads will be forced inward and to the engaged position. Thus the device can quickly and easily accomodate damaged IC devices.

While the present invention has been described by means of a single preferred embodiment, it is to be understood that numerous changes and modifications may be made therein without departing from the spirit and scope of the invention as defined in the appended claims.

Having described our invention, we now claim:

1. A pin crimping apparatus for crimping the leads of a multiple lead header into contact, comprising:
   guide means for guiding a plurality of multiple pin headers along a path with the pins of said headers oriented in a predetermined common direction,
   first and second crimping wheels rotatably mounted adjacent to and disposed on opposite sides of said guide means, said crimping wheels positioned so that the rims of said wheels engage the pins of a header passing therebetween for biasing said pins toward the axis thereof into mutual engagement with one another, and means for rotating said wheels; in the same direction at different speeds.

2. The pin crimping apparatus of claim 1, wherein one of said wheels is floatingly mounted adjacent said guide means and is biased toward said guide means.

3. The pin crimping apparatus of claim 1, wherein said wheels include a resilient rim for engagement with said pins.

4. The pin crimping apparatus of claim 2, wherein said floating wheel is mounted on an arm pivotally mounted adjacent said track and including spring means for biasing said wheel toward said track.

5. The pin crimping apparatus of claim 4, wherein said guide means is a channel defining a generally T-shaped slot having an upwardly opening slot defined by horizontally extending walls.

6. The pin crimping apparatus of claim 1, wherein said crimping wheels are rotatably mounted adjacent to and partially overlapping said channel.

7. A pin crimping apparatus for crimping the leads of a multiple lead header into contact, comprising:
   elongated channel means for guiding a plurality of multiple pin headers along a path with the pins of said headers oriented in a predetermined common direction, said channel means including a generally T-shaped slot wherein the body of said header is rotatably retained in said channel by overlapping walls of said channel and the pin of said header extends beyond said walls,
   first and second crimping wheels rotatably mounted adjacent to and on opposite sides of said channel, said crimping wheels rotatably driven and positioned for engaging the pins of a header passing therebetween for rotating the header and biasing said pins toward the axis thereof into mutual engagement with one another.

8. The pin crimping apparatus of claim 7, wherein said wheels rotate in the same direction at different speeds.

9. The pin crimping apparatus of claim 8, wherein said wheels include a resilient rim for engagement with said pins.

* * * * *